(12) United States Patent
Hirayama et al.

(10) Patent No.: US 8,409,884 B2
(45) Date of Patent: Apr. 2, 2013

(54) PROCESS FOR PRODUCING ORGANIC ELECTROLUMINESCENT PANEL

(75) Inventors: Takamasa Hirayama, Ibaraki (JP); Akihisa Murata, Ibaraki (JP); Yukio Arimitsu, Ibaraki (JP); Takashi Yamaoka, Ibaraki (JP); Masaaki Sato, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/003,269

(22) PCT Filed: Jun. 30, 2009

(86) PCT No.: PCT/JP2009/003030
§ 371 (c)(1),
(2), (4) Date: Jan. 7, 2011

(87) PCT Pub. No.: WO2010/004703
PCT Pub. Date: Jan. 14, 2010

(65) Prior Publication Data
US 2011/0124136 A1   May 26, 2011

(30) Foreign Application Priority Data

Jul. 8, 2008   (JP) ................. 2008-178181

(51) Int. Cl.
*H01L 51/50* (2006.01)
*C09J 5/06* (2006.01)
*C09J 7/02* (2006.01)

(52) U.S. Cl. .......... 438/26; 156/280; 156/713; 156/719; 438/29; 438/99

(58) Field of Classification Search .............. 438/34, 438/41; 257/E33.013
See application file for complete search history.

(56) References Cited

U.S. PATENT DOCUMENTS

| 7,186,581 | B2* | 3/2007 | Seki et al. ............. 438/34 |
| 2001/0033347 | A1* | 10/2001 | Kitahora et al. ............ 349/58 |
| 2003/0232192 | A1* | 12/2003 | Kishioka et al. ............ 428/354 |
| 2006/0225914 | A1* | 10/2006 | Tan .................... 174/254 |
| 2010/0021668 | A1 | 1/2010 | Shimokawa et al. |

FOREIGN PATENT DOCUMENTS

| EP | 0257984 A2 | 3/1988 |
| JP | 08053653 | 2/1996 |

(Continued)

OTHER PUBLICATIONS

Notification of Reasons for Refusal issued in Application No. 2010-519631 dated Jul. 17, 2012.

(Continued)

*Primary Examiner* — Olik Chaudhuri
*Assistant Examiner* — Wilner Jean Baptiste
(74) *Attorney, Agent, or Firm* — Sughrue Mion, PLLC

(57) ABSTRACT

The process for producing an organic EL panel according to the present invention is a process for producing an organic electroluminescent panel by forming an organic electroluminescent element on an ultrathin glass plate by vacuum deposition method, including forming electrodes on the ultrathin glass plate, by temporarily fixing the ultrathin glass plate to a supporting plate via a double-sided adhesive tape having a thermal release adhesive layer formed at least on one face of the base material layer, containing heat-expandable microspheres that start expansion and/or foaming at temperature higher than the vacuum deposition temperature.

6 Claims, 1 Drawing Sheet

FOREIGN PATENT DOCUMENTS

| | | |
|---|---|---|
| JP | 09-260058 A | 10/1997 |
| JP | 2001040300 | 2/2001 |
| JP | 2002-069410 A | 3/2002 |
| JP | 2002-367778 A | 12/2002 |
| JP | 2003-292916 A | 10/2003 |
| JP | 2004-079432 A | 3/2004 |
| JP | 2004-192961 A | 7/2004 |
| JP | 2005524946 A | 8/2005 |
| JP | 2007-019471 A | 1/2007 |
| JP | 2008-123948 A | 5/2008 |
| JP | 2008-144116 A | 6/2008 |
| WO | WO 03096440 A2 | 11/2003 |

OTHER PUBLICATIONS

Notification of First Office Action issued in counterpart Chinese Application No. 200980125066.0 dated Aug. 1, 2012.

European Office Action issued in Application No. 09794151.2 dated Aug. 28, 2012.

European Search Report issued in Application No. 09794151.2 dated Nov. 24, 2011.

Japanese Office Action issued in Application No. 2010-519631 dated Dec. 6, 2011.

* cited by examiner

PROCESS FOR PRODUCING ORGANIC ELECTROLUMINESCENT PANEL

TECHNICAL FIELD

The present invention relates to a process for producing an organic electroluminescent panel by using a double-sided adhesive tape. The organic electroluminescent panel according to the present invention is very useful as display devices, displays or as various kinds of emission light sources.

BACKGROUND ART

Organic electroluminescent elements (hereinafter, an organic electroluminescent may be referred to as "organic EL") are light-emitting elements in a structure having a light-emitting layer containing a light-emitting compound held between negative and positive electrodes, in which excitons are generated by recombination of electrons and positive holes injected into the light-emitting layer and light (fluorescence or phosphorescence) is emitted when the excitons are inactivated. These elements are attracting attention recently, as they emit light even at a voltage approximately of several to several tens V, and are characteristic of wide view angle and high visibility because they are self-emitting type elements and also superior in size and portability because they are thin film-shaped completely solid-state elements. The organic EL panels, which have such an organic EL element formed on a substrate, can be used as display devices, displays, and various emission light sources.

Currently, particularly among the organic EL panels, flexible displays, which can be used as folded, are attracting attention. For production of flexible displays, a flexible material should be used as the substrate for such an organic EL element. In addition, organic solids used in organic EL elements, such as light-emitting layer (organic emitter), electron, and positive hole transport materials, had a problem that they are generally extremely unstable to water and oxygen, and degraded by water and oxygen present in organic EL element and also by water and oxygen penetrating into the element from outside, leading to growth of so-called dark spots, deterioration in light permeability and thus drastic decrease in luminous efficiency. For that reason, the substrate should have high gas barrier properties. Use of an ultrathin glass plate as the substrate for that reason is known to satisfy the requirements both in flexibility and gas barrier properties (reference 1).

However, the ultrathin glass plates are very brittle and, if an ultrathin glass plate is conveyed alone in the production process for forming an organic EL element on the ultrathin glass plate, there is a problem of decrease in yield caused by generation of "fractures" and "cuts" in the ultrathin glass plate during conveyance. Known as the methods of preventing the "fractures" and "cuts" during conveyance are a jig-set method of conveying the ultrathin glass plate, as it is temporarily fixed with a jig, a sheet-bonding method of conveying the ultrathin glass plate, as it is temporarily bonded to an adhesive sheet, and a substrate-bonding method of conveying the ultrathin glass plate, as it is bonded to a support with a wax or bonding agent. However, in the case of the jig-set method, a jig suitable for each treatment process should be selected and used, as residual of the chemical solution and unevenness of the treatment during WET treatment (chemical solution treatment) are taken into consideration. Accordingly, the method has a problem of low maintenance efficiency and low processability. Alternatively in the case of the sheet-bonding method, the ultrathin glass plate may be fractured by the stress applied for separation of the adhesive sheet that became unneeded after production process. Alternatively in the case of the substrate-bonding method of conveying the ultrathin glass plate, as it is bonded to a substrate with a wax or bonding agent, an additional step of removing the wax or bonding agent deposited on the rear face of the ultrathin glass plate with organic solvent should be installed after production process, which makes it difficult to improve productivity.

Japanese Unexamined Patent Publication No. 2003-292916 (Patent Document 2) describes an thermal release adhesive sheet (heat-peelable adhesive sheet) that is an adhesive sheet used for temporary fixing of a brittle bonding target, characterized in that even a brittle bonding target can be separated and recovered easily without damage by heat treatment and at least one face of the base substance has a heat-expanding adhesive layer containing heat-expandable microspheres. The heat-expandable microsphere contains hydrocarbon gas in a spherical rubber-like elastic body and has a property that the rubber-like elastic body expands and/or foams, as the hydrocarbon gas expands when heated at a temperature of more than a particular temperature. However, although there is no thermal expansion when heated at a temperature not higher than the expansion and/or foaming temperature, the hydrocarbon gas may be released externally as offgas at a temperature close to it. If the thermal release adhesive sheet is used as a sheet for temporary fixation of the ultrathin glass plate, when an organic electroluminescent element is formed on an ultrathin glass plate by vacuum deposition method in the production step for organic EL panels, hydrocarbon gas may be generated in a great amount in the vacuum chamber, causing decrease in the degree of vacuum and elongation of the period needed for the vacuum chamber to reach a desired degree of vacuum, causing a problem of drastic deterioration in film precision and productivity. In other words, there is currently no available process for producing an organic EL panel superior in flexibility and gas barrier properties by using an ultrathin glass plate, by which it is possible to protect the ultrathin glass plate from generation of "fractures" and "cuts" during conveyance in the production process, to produce the organic EL element efficiently by evacuating the system to a particular degree of vacuum rapidly when an organic EL element is formed by vacuum deposition, and to recover the organic EL panel obtained without damage of the ultrathin glass plate after production process, and in which there is no need for an additional cleaning step of removing the adhesive substance and others deposited on the rear face of the ultrathin glass plate.

CITATION LIST

Patent Literature

Patent Document 1: JP-A No. 2004-79432
Patent Document 2: JP-A No. 2003-292916

SUMMARY OF INVENTION

Technical Problem

Thus, an object of the present invention is to provide a process for producing an organic EL panel superior in flexibility and gas barrier properties by using an ultrathin glass plate, characterized in that it is possible thereby to protect the ultrathin glass plate from generation of "fractures" and "cuts" during conveyance in the production process, to produce the organic EL element efficiently by evacuating the system to a particular degree of vacuum rapidly when an organic EL element is formed by vacuum deposition, and to recover the organic EL panel obtained without damage of the ultrathin glass plate after production process, and there is no need for an additional cleaning step of removing the adhesive substance and others deposited on the rear face of the ultrathin glass plate.

Solution to Problem

After intensive studies to solve the problems above, the inventors have found that it is possible, by forming an organic EL element on an ultrathin glass plate, as the ultrathin glass plate is fixed temporarily to a supporting plate with a double-sided adhesive tape having a thermal release adhesive layer containing heat-expandable microspheres that start expansion and/or foaming at temperature higher than the vacuum deposition temperature at least on one face thereof, to protect the ultrathin glass plate from generation of "fractures" or "cuts" during conveyance, to form an organic EL element efficiently by evacuating the system to a particular degree of vacuum rapidly when an organic EL element is formed by vacuum deposition, and to decrease the adhesive power of the double-sided adhesive tape drastically after production process by heating it at a temperature not lower than a particular temperature, and thus, to separate the ultrathin glass plate of organic EL panel without fracture and cleanly without residual of the adhesive and that there is no need for installation of an additional cleaning step of cleaning the rear face of the ultrathin glass plate, and made the present invention.

Specifically, the present invention provides a process for producing an organic electroluminescent panel by forming an organic electroluminescent element on an ultrathin glass plate by vacuum deposition method, comprising the steps of temporarily fixing the ultrathin glass plate having a thickness of 10 to 150 μm to a supporting plate via a double-sided adhesive tape having a thermal release adhesive layer formed at least on one face of the base material layer, and containing heat-expandable microspheres that start expansion and/or foaming at temperature higher than the vacuum deposition temperature; and forming electrodes on the ultrathin glass plate.

The double-sided adhesive tape preferably has a thermal release adhesive layer containing heat-expandable microspheres that start expansion and/or foaming at a temperature higher by 20° C. or more than the vacuum deposition temperature.

The double-sided adhesive tape includes double-sided adhesive tapes in which the adhesive layer on one face of the double-sided adhesive tape is a thermal release adhesive layer and the adhesive layer on the other face is a pressure-sensitive or active energy ray-curable adhesive layer and double-sided adhesive tapes in which the adhesive layers on both faces are thermal release adhesive layers.

Advantageous Effects of Invention

According to the process for producing an organic EL panel of the present invention, there is no generation of "fractures" and "cuts" in the ultrathin glass plate, for example during conveyance in the production process, because the organic EL element is formed, as an ultrathin glass plate having a thickness of 10 to 150 μm is temporarily bonded to a supporting plate with a particular double-sided adhesive tape. Since the double-sided adhesive tape containing heat-expandable microspheres that starts expansion and/or foaming at a temperature higher than the vacuum deposition temperature is used as the double-sided adhesive tape, there is no offgas generated during production of the organic EL element by vacuum deposition method and it is possible to evacuate the system rapidly into vacuum state and thus to improve the film precision and productivity.

It is also possible to expand and/or foam the heat-expandable microspheres in the double-sided adhesive tape rapidly by heating at a predetermined temperature after production process, and decrease the adhesion face with the ultrathin glass plate significantly. It is thus possible to separate the ultrathin glass plate easily without fracture thereof and residual of the adhesive, therefore there is no need for cleaning the rear face of the ultrathin glass plate in the organic EL panel after separation. In addition, there is no need for use of an organic solvent or the like, which has been used traditionally in the cleaning step to remove the adhesive residue on the rear face of the substrate, thus eliminating the possibility of problems such as low processability and environmental pollution. The organic EL panel obtained by the process for producing an organic EL panel according to the present invention is higher in flexibility and superior in gas barrier properties, and is thus resistant significantly to growth of so-called dark spots, deterioration in light transmittance, and also drastic decrease in light-emitting efficiency over an extended period of time, and useful as a long-lasting flexible display.

DESCRIPTION OF EMBODIMENTS

Figure 1:
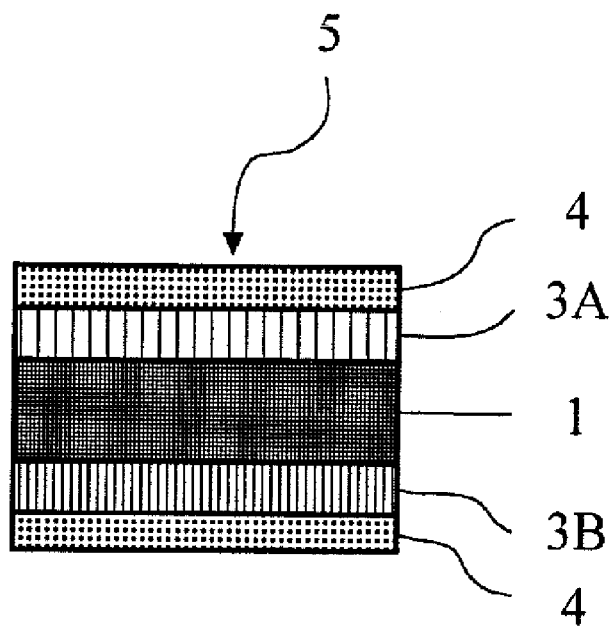
FIG. 1 is a schematic sectional view showing an example of the double-sided adhesive tape used in the process for producing an organic EL panel according to the present invention.

Hereinafter, favorable embodiments of the present invention will be described with reference to drawings as needed. FIG. 1 is a schematic sectional view showing an example of the double-sided adhesive tape used in the process for producing an organic EL panel according to the present invention, in which adhesive layers 3A and 3B are formed on both faces of a base material layer 1 and separators 4 are laminated on the adhesive layers 3A and 3B.

Figure 2:
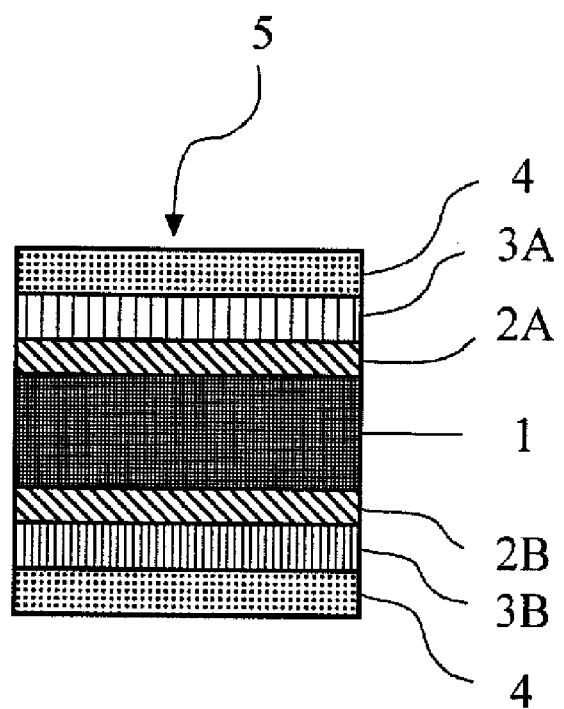
FIG. 2 is a schematic sectional view showing another example of the double-sided adhesive tape used in the process for producing an organic EL panel according to the present invention.

FIG. 2 is a schematic sectional view showing another example of the double-sided adhesive tape used in the process for producing an organic EL panel according to the present invention, in which adhesive layers 3A and 3B are formed, respectively via rubber-like organic elastic layers 2A and 2B, on both faces of a base material layer 1 and separators 4 are laminated on the adhesive layers 3A and 3B.

The process for producing an organic EL panel according to the present invention is a process for producing an organic electroluminescent panel by forming an organic electroluminescent element on an ultrathin glass plate having a thickness of 10 to 150 μm by vacuum deposition, comprising forming electrodes on the ultrathin glass plate, by temporarily fixing the ultrathin glass plate to a supporting plate, via a double-sided adhesive tape having a thermal release adhesive layer (heat-peelable adhesive layer) at least on one face of the base material layer, containing heat-expandable microspheres that start expansion and/or foaming at temperature higher than the vacuum deposition temperature.

[Double-Sided Adhesive Tape]

The double-sided adhesive tape according to the present invention has a base material layer, which is formed from the viewpoints of handleability, processability and others, and a thermal release adhesive layer containing heat-expandable microspheres that start expansion and/or foaming at temperature higher than the vacuum deposition temperature formed at least on one face of the base material layer. The adhesive layer in the double-sided adhesive sheet according to the present invention may be protected before use, as it is bonded to a separator (release liner).

The adhesive layer formed at least on one face of the double-sided adhesive tape is desirably a thermal release adhesive layer, and, for example, the adhesive layers on both faces of the double-sided adhesive tapes may be thermal release adhesive layers, or an adhesive layer (in particular, the layer having the surface bonding to the ultrathin glass plate) formed on one face of the double-sided adhesive tape may be a thermal release adhesive layer and the adhesive layer formed on the other face may be a pressure-sensitive or active energy ray-curable adhesive layer containing no heat-expandable microspheres.

The double-sided adhesive tape according to the present invention preferably has thermal release adhesive layers containing heat-expandable microspheres on both faces of the double-sided adhesive tape, particularly because it is possible to reduce the tackiness of both faces of the double-sided adhesive tape in a heat treating step significantly and make the organic EL panel and the supporting plate separated easily from the double-sided adhesive tape. It is possible to reduce the energy cost of separation and simplify the separating operation by use of the double-sided adhesive tape.

[Thermal Release Adhesive Layer]

The thermal release adhesive layer according to the present invention contains heat-expandable microspheres and also an adhesive for giving tackiness. The thermal release adhesive layer containing heat-expandable microspheres starts, when heated, expansion and/or foaming of the heat-expandable microspheres therein, which leads significant drop of the adhesion area between the bonding target and the adhesive layer and thus to rapid decrease in adhesive power. Thus, the adhesive layer is highly adhesive in the state unheated, but can be separated easily under heat, when it is desirably separated. Microcapsulated foaming agents assure favorable releasability.

The thermal release adhesive layer is preferably formed as the surface layer (outermost layer) of the double-sided adhesive tape, but may be formed as a layer beneath the surface layer. In such a case, another layer, such as anti-staining layer, is formed on the thermal release adhesive layer.

The adhesive is preferably an adhesive that does not inhibit the expansion and/or foaming of the heat-expandable microsphere when heated as much as possible. The adhesive that may be used is, for example, one or more known adhesives selected from rubber-based adhesives, acrylic adhesives, vinyl alkylether-based adhesives, silicone-based adhesives, polyester-based adhesives, polyamine-based adhesives, urethane-based adhesives, styrene-diene block copolymer-based adhesives, and adhesives improved in creep properties in combination of the adhesive above with a hot-melt resin having a melting point of approximately 200° C. or lower (see, for example, JP-A Nos. 56-61468, 63-30205, and 63-17981 and others). The adhesive may contain, in addition to the adhesive component (base polymer), suitable additives such as crosslinking agents (such as polyisocyanates or alkyletherified melamine compounds), tackifiers (such as rosin-derived resins, polyterpene resins, petroleum resins, or oil-soluble phenol resins), plasticizers, fillers, and aging inhibitors.

The adhesives generally used include rubber-based adhesives containing natural rubber or synthetic rubber as the base polymer; acrylic adhesive having, as its base polymer, an acrylic polymer (homopolymer or copolymer) produced by using, as the monomer components, one or more alkyl(meth)acrylate esters (for example, $C_{1-20}$ alkyl esters such as methyl ester, ethylester, propyl ester, isopropyl ester, butyl ester, isobutyl ester, s-butyl ester, t-butyl ester, pentyl ester, hexyl ester, heptyl ester, octyl ester, 2-ethylhexylester, isooctyl ester, isodecyl ester, dodecyl ester, tridecyl ester, pentadecyl ester, hexadecyl ester, heptadecyl ester, octadecyl ester, nonadecyl ester, and eicosyl ester and the like.)

The acrylic polymer may contain units corresponding to the other monomer components copolymerizable with the alkyl(meth)acrylate ester added for the purpose of modification of cohesive power, heat resistance, crosslinking efficiency, and others. Examples of such monomer components include carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, and (4-hydroxymethylcyclohexyl)methyl methacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; (N-substitution) amide-based monomers such as (meth)acrylamide, N,N-dimethyl(meth)acrylamide, N-butyl(meth)acrylamide, N-methylol(meth)acrylamide, and N-methylolpropane(meth)acrylamide; aminoalkyl (meth)acrylate-based monomers such as aminoethyl (meth)acrylate, N,N-dimethylaminoethyl (meth)acrylate, and t-butylaminoethyl (meth)acrylate; alkoxyalkyl (meth)acrylate-based monomers such as methoxyethyl (meth)acrylate and ethoxyethyl (meth)acrylate; maleimide-based monomers such as N-cyclohexylmaleimide, N-isopropylmaleimide, N-laurylmaleimide, and N-phenylmaleimide; itaconimide-based monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide-based monomers such as N-(meth)acryloyloxymethylene succinimide, N-(meth)acryloyl-6-oxyhexamethylene succinimide and N-(meth)acryloyl-8-oxyoctamethylene succinimide; vinyl monomers such as vinyl acetate, vinyl propionate, N-vinylpyrrolidone, methylvinylpyrrolidone, vinylpyridine, vinyl piperidone, vinylpyrimidine, vinylpiperazine, vinyl pyrazine, vinylpyrrole, vinylimidazole, vinyloxazole, vinylmorpholine, N-amides vinylcarboxylate, styrene, α-methylstyrene, and N-vinylcaprolactam; cyanoacrylate monomers such as acrylonitrile and methacrylonitrile; epoxy group-containing acrylic monomers such as glycidyl (meth)acrylate; glycol-based acryl ester monomers such as polyethylene glycol (meth)acrylate, polypropylene glycol (meth)acrylate, methoxyethylene glycol (meth)acrylate, and methoxypolypropylene glycol (meth)acrylate; acrylic ester-based monomers having heterocyclic rings, halogen atoms, silicon atoms or the like such as tetrahydrofurfuryl (meth)acrylate, fluorine (meth)acrylate, silicone (meth)acrylate;

multifunctional monomers such as hexanediol di(meth)acrylate, (poly)ethylene glycol di(meth)acrylate, (poly)propylene glycol di(meth)acrylate, neopentylglycol di(meth)acrylate, pentaerythritol di(meth)acrylate, trimethylolpropane tri(meth)acrylate, pentaerythritol tri(meth)acrylate, dipentaerythritol hexa(meth)acrylate, epoxyacrylate, polyester acrylate, and urethane acrylates; olefin monomers such as isoprene, butadiene, and isobutylene; and vinylether-based monomers such as vinyl ether and the like. These monomer components may be used alone or in combination of two or more.

The adhesive is more preferably a pressure-sensitive adhesive containing, as its base material, a polymer having a dynamic modulus in the range of 5000 to 1000,000 Pa at the temperature in the range of normal temperature to 150° C., from the points of the balance between favorable adhesive strength before heat treatment and deterioration in adhesive strength after heat treatment.

The heat-expandable microsphere used in the thermal release adhesive layer is desirably, for example, a microsphere containing a substance that easily expands by vaporization under heat, such as isobutane, propane or pentane, as it is enclosed in an elastic shell. The shell is often made of a hot-melt substance or a substance that is broken by heat expansion. Examples of the shell-forming substances include vinylidene chloride-acrylonitrile copolymers, polyvinylalcohol, polyvinylbutyral, polymethyl methacrylate, polyacrylonitrile, polyvinylidene chloride, polysulfone, and the like. The heat-expandable microsphere can be prepared by a common method, for example by coacervation, interfacial polymerization or the like. Examples of the heat-expandable microspheres according to the present invention include commercially available products such as "Microspheres F30D and F50D" (R) produced by Matsumoto Yushi-Seiyaku Co., Ltd.

When the double-sided adhesive tape according to the present invention has thermal release adhesive layers on both faces of the base material layer, the thermal release adhesive layers may contain heat-expandable microspheres that start expansion and/or foaming at the same temperature or heat-expandable microspheres that starts expansion and/or foaming at different temperatures, but in particular, heat-expandable microspheres that starts expansion and/or foaming at the same temperature are preferably contained. It is because it is possible to separate the organic EL panel and the supporting plate simultaneously from the double-sided adhesive tape by heat-treating the organic EL panel and the supporting plate when they are separated after the production process and thus, to reduce the energy cost.

Heat-expandable microspheres having a suitable strength and thus prohibiting bursting at a volumetric expansion rate of up to 5 times or more, in particular of up to 7 times or more, particularly to up to 10 times or more are favorable, for efficient reduction of the adhesive strength of the adhesive layer by heat treatment.

The blending amount of the heat-expandable microspheres can be determined properly, for example, according to the desired expansion rate and the desired rate of reduction in adhesive power (adhesive strength) of the adhesive layer, but is generally, for example, 1 to 150 wt parts, preferably 5 to 100 wt parts, with respect to the 100 wt parts of the base polymer forming the thermal release adhesive layer (for example, acrylic polymer in the case of acrylic adhesive). When the blending amount of the heat-expandable microspheres is less than 1 wt part, it may not be possible to provide sufficient separation efficiency, while, when the blending amount is more than 150 wt parts, the adhesiveness of the adhesive layer surface may decline because of surface irregularity. Particularly in the present invention, if the ultrathin glass plate is desirably separated easily without damage after production process. When the thermal release adhesive layer is formed thinner, it is preferable that the blending amount of the heat-expandable microspheres is reduced to some extent to make to surface state stabilized. For the reason above, a blending amount (30 to 80 wt parts) of about half of the blending amount needed for complete separation (zero adhesive power) is most favorable.

The thermal expansion-starting temperature of the thermal release adhesive layer according to the present invention is determined properly according to the vacuum deposition temperature when the organic EL element is formed, and the temperature at which expansion and/or foaming of the heat-expandable microsphere start is preferably a temperature of 20° C. or higher (preferably, 50° C. or higher, particularly preferably, 70° C. or higher) than the vacuum deposition temperature. The thermal expansion-starting temperature is specifically 130 to 250° C., preferably 150 to 230° C. A thermal expansion-starting temperature of less than 130° C. may result, for example, in release of offgas from the heat-expandable microspheres when heated for production of the organic EL element by vacuum deposition, which in turn leads to decrease in the degree of vacuum of vacuum chamber and elongation of the period needed to make it reach a desired degree of vacuum, and consequently to significant degrease in film precision and productivity. On the other hand, when the thermal expansion-starting temperature is higher than 250° C., higher temperature is needed for improvement in the separation efficiency in the separation step, which occasionally leads to breakage of the organic EL panel by deformation caused by heat. The "thermal expansion-starting temperature", as used in the present invention, is the temperature at which expansion and/or foaming of the heat-expandable microspheres starts, when the heat-expandable microsphere is analyzed in a thermal analyzer (trade name: "TMA/SS6100", manufactured by SII NanoTechnology Inc.) by an expansion method (load: 19.6 N, probe: 3 mmϕ).

The thermal expansion-starting temperature can be controlled properly, for example, by adjusting the kind and the particle diameter distribution of the heat-expandable microspheres. It is possible in particular to control the temperature easily by narrowing the particle diameter distribution of the heat-expandable microspheres by classification of the heat-expandable microspheres. Any known method, whether it is a dry or wet method, may be used as the classification method, and the classification apparatuses that can be used include known classification apparatuses such as gravity classifiers, inertia classifiers, and centrifugal classifiers.

The thermal release adhesive layer can be prepared by a suitable method, for example, by preparing a coating solution containing an adhesive and heat-expandable microspheres by using a solvent as needed, and coating the solution on a base material layer or a rubber-like organic elastic layer (dry coating method), by preparing a thermal release adhesive layer by coating the coating agent on a suitable separator (such as release paper) and transferring the adhesive layer onto a base material layer or a rubber-like organic elastic layer (dry lamination method), or by coextruding a resin composition containing the constituent materials for the base material layer with a resin composition containing the materials for the thermal release adhesive layer (coextrusion method). The thermal release adhesive layer may be a single layer or a laminate layers.

The thickness of the thermal release adhesive layer is preferably larger than the maximum diameter of the heat-expandable microspheres contained and, for example, 5 to 300 μm, preferably about 10 to 100 μm. When the thickness is too large, cohesive failure may occur during separation after heat treatment, leaving the adhesive residue on the organic EL panel and thus, leading to deterioration in separation efficiency. On the other hand, when the thickness is too small, the surface smoothness of the adhesive layer may be damaged by the irregularity of the heat-expandable microspheres, possibly leading to deterioration in adhesiveness and drop out during temporary fixation. It may also lead to decrease in the degree of deformation of the thermal release adhesive layer by heat treatment and resistance to smooth drop of the adhesive strength, and thus, it may be needed to excessively reduce the particle diameter of the heat-expandable microspheres added for preservation of the adhesiveness during temporary fixation.

[Pressure-Sensitive Adhesive Layer]

The adhesion component contained in the pressure-sensitive adhesive layer is not particularly limited, and those exemplified for the thermal release adhesive layer may be used favorably. The pressure-sensitive adhesive layer can prepared by a suitable method, for example, by preparing a coating solution containing an adhesive, by using a solvent as needed, and coating the solution on a base material layer or a rubber-like organic elastic layer (dry coating method), by preparing a pressure-sensitive adhesive layer by coating the coating agent on a suitable separator (such as release paper) and transferring the adhesive layer onto a base material layer or a rubber-like organic elastic layer (dry lamination method), or by coextruding a resin composition containing the constituent materials for the base material layer with a resin composition containing the materials for the pressure-sensitive adhesive layer (coextrusion method). The pressure-sensitive adhesive layer may be a single layer or a laminate layers.

[Active Energy Ray-Curable Adhesive Layer]

The active energy ray-curable adhesive layer is characterized by having a property of being cured by irradiation of active energy ray. The layer preferably contains polymerizable carbon-carbon double bonds for expression of the active energy ray curability, and for example, a active energy ray-curable adhesive containing a polymer having polymerizable carbon-carbon double bonds in the branched chains and terminals as the base polymer may be used, or alternatively an addition-type active energy ray-cureble adhesive containing a monomer or oligomer component having side-chains having polymerizable carbon-carbon double bonds may be used as the adhesive agent. The term "active energy ray", as used in the present invention, means, for example, ultraviolet ray, visible ray, infrared ray or radiation ray.

The active energy ray-curable adhesive containing a polymer having polymerizable carbon-carbon double bonds in the branched chains and terminals as the base polymer is a known adhesive or an adhesive in combination of one two or more known adhesives such as rubber-based adhesives, acrylic adhesives, vinyl alkylether-based adhesives, silicone-based adhesives, polyester-based adhesives, polyamine-based adhesives, urethane-based adhesives, styrene-diene block copolymer-based adhesives, adhesives improved in creep property in combination of the adhesive above and a hot-melt resin having a melting point of approximately 200° C. or lower blended therewith (see, for example, JP-A Nos. 56-61468 and 63-17981). In particular, acrylic adhesives are preferable. The adhesive may contain, in addition to the adhesive component (base polymer), suitable additives such as crosslinking agents (such as polyisocyanates and alkyletherified melamine compounds), tackifiers (such as rosin derivative resins, polyterpene resins, petroleum resins, and oil-soluble phenol resin), plasticizers, fillers, and aging inhibitors.

The adhesive component (base polymer) can be obtained by introducing one or more polymerizable carbon-carbon double bonds into a basic skeleton acrylic copolymer. When the base polymer has polymerizable carbon-carbon double bonds, the active energy ray curable monomer or oligomer components may not be added separately. Thus, the acrylic polymer having polymerizable carbon-carbon double bonds may not contain the low-molecular weight oligomer components or the like or may contain them in lower amounts and thus, it is possible to form an adhesive layer in a stabilized layer structure without migration of the oligomer components and others in the adhesive layer over time.

The method of introducing polymerizable carbon-carbon double bonds into the acrylic copolymer is not particularly limited, and various methods may be used. For example, monomers having a functional group monomer are copolymerized previously for preparation of an acrylic copolymer and then, a compound having a functional group reactive with the functional group and having polymerizable carbon-carbon double bonds may be condensed with or added to the acrylic copolymer, while the active energy ray curability of the polymerizable carbon-carbon double bonds is preserved.

Examples of the combinations of the high-reactivity functional groups include carboxylic and epoxy groups, carboxylic and aziridine groups, hydroxyl and isocyanate groups, and the like. Among these combinations of functional groups, the combination of hydroxyl and isocyanate groups is favorable from the point of easy traceability of the reaction. Each functional group may be present either in the acrylic copolymer or in the compound having a functional group and polymerizable carbon-carbon double bonds. In particular, it is preferable that the acrylic copolymer has hydroxyl groups and the compound having a functional group and polymerizable carbon-carbon double bonds has an isocyanate group. Examples of the compounds having a functional group and polymerizable carbon-carbon double bonds in this case include methacryloisocyanate, 2-methacryloyloxyethyl isocyanate, misopropenyl-α,α-dimethylbenzyl isocyanate and the like. In addition, copolymers of the hydroxyl group-containing monomer exemplified above and an ether compound such as 2-hydroxyethyl vinylether, 4-hydroxybutyl vinylether or diethylene glycol monovinylether are used as the acrylic copolymers. The acrylic copolymers containing polymerizable carbon-carbon double bonds may be used alone or in combination of two or more.

The addition-type active energy ray-curable adhesive in combination of the adhesive and a monomer or oligomer component having a side chain containing polymerizable carbon-carbon double bonds blended thereto can be prepared by blending a active energy ray-curable monomer or oligomer component with an adhesive. The adhesive is preferably an acrylic adhesive.

The active energy ray-curable monomer or oligomer component for use is, for example, a monomer or oligomer having a functional group, such as carbon-carbon double bond, that crosslinks by irradiation with active energy ray. In particular, a monomer or oligomer having averagely six or more carbon-carbon double bonds in the molecule is preferable. Examples of the monomers or oligomers include trimethylolpropane tri(meth)acrylate, pentaerythritol tri(meth)acrylate, dipentaerythritol hexa(meth)acrylate, tetraethylene glycol di(meth)acrylate, 1,6-hexanediol (meth)acrylate, neopentylglycol di(meth)acrylate, ester compound of (meth)acrylic esters and a polyvalent alcohol, acrylic ester oligomers, 2-propenyl-3-butenyl cyanurate, isocyanurate, isocyanurate compounds and the like. In particular, dipentaerythritol hexa (meth)acrylate is preferable. The active energy ray-curable monomer or oligomer components may be used alone or as a mixture of two or more.

The active energy ray-curable adhesive layer is prepared by a suitable method, for example, by preparing a coating solution containing an adhesive, by using a solvent as needed, and coating the solution on a base material layer or a rubber-like organic elastic layer (dry coating method), by preparing a active energy ray-curable adhesive layer by coating the coating agent on a suitable separator (such as release paper) and transferring the adhesive layer onto a base material layer or a rubber-like organic elastic layer (dry lamination method), or by coextruding a resin composition containing the constituent materials for the base material layer with a resin composition containing the materials for the active energy ray-curable adhesive layer (coextrusion method). The active energy ray-curable adhesive layer may be a single layer or a laminate layers.

[Base Material Layer]

The base material constituting the base material layer is not particularly limited and various base materials may be used, and examples thereof for use are suitable film-shaped materials including fiber-based base materials such as woven and nonwoven fabrics, felts and nets; paper-based base materials such as various kinds of paper; metal-based base material such as metal foils and plates; plastic-based base materials such as various resin films and sheets; rubber-based base materials such as rubber sheets; foams such as foam sheets; laminated films thereof and the like. Examples of the material or raw materials for the plastic-based base material include polyesters (such as polyethylene terephthalate, polyethylene naphthalate, polybutylene terephthalate, and polybutylene naphthalate), polyolefins (such as polyethylene, polypropylene, and ethylene-propylene copolymers), polyvinylalcohol, polyvinylidene chloride, polyvinyl chloride, vinyl chloride-vinyl acetate copolymers, polyvinyl acetate, polyamides, polyimides, celluloses, fluorine resins, polyether, polystyrene resins (such as polystyrene), polycarbonate, polyether sulfone and the like. The base material layer may have a shape of single layer or laminate layer.

The thickness of the base material layer is not particularly limited, but preferably 500 µm or less, more preferably about 5 to 250 µm.

The surface of the base material layer may be, as needed, subjected to a common surface treatment, for example to oxidation by a chemical or physical method, such as chromate treatment, ozone exposure, flame exposure, high-pressure electrical shock exposure or ionizing radiation treatment, for improvement of the adhesiveness for example with the thermal release adhesive layer.

[Rubber-Like Organic Elastic Layer]

The double-sided adhesive tape according to the present invention preferably has a rubber-like organic elastic layer between the base material layer and the adhesive layers placed on both faces of the base material layer. The rubber-like organic elastic layer has a function to make the surface of the double-sided adhesive tape fit favorably to the surface shape of the ultrathin glass plate and increase the adhesion area between them when a double-sided adhesive tape is bonded to an ultrathin glass plate and also a function to help construction of a waving structure by three-dimensional structural transition of the thermal release adhesive layer during heated separation (thermal peeling).

The rubber-like organic elastic layer, which has the functions above, is preferably formed with a natural rubber, a synthetic rubber or a rubber elastic synthetic resin having a Shore D hardness, as determined according to ASTM D-2240, for example of 50 or less, particularly 40 or less.

Examples of the synthetic rubbers or the rubber elastic synthetic resins include synthetic rubbers such as nitrile-, diene-, and acrylic-based rubbers; thermoplastic elastomers such as polyolefin- and polyester-based elastomers; rubber elastic synthetic resins such as ethylene-vinyl acetate copolymers, polyurethane, polybutadiene, and soft polyvinyl chloride; and the like. Inherently hard polymers such as polyvinyl chloride can show rubber elasticity, when combined with a compounding agent such as plasticizer or softener, and thus, such a composition can also be used as the material constituting the rubber-like organic elastic layer. The adhesives constituting the thermal release adhesive layer described above can also be used favorably as the materials constituting the rubber-like organic elastic layer.

The thickness of the rubber-like organic elastic layer is generally about 5 to 300 µm, preferably about 5 to 100 µm. When the thickness is too large, three-dimensional structural transition of the thermal release adhesive layer may be inhibited, leading to deterioration in separation efficiency in the separation step.

The rubber-like organic elastic layer is formed, for example, by preparing a coating solution containing the materials for the rubber-like organic elastic layer such as the natural rubber, synthetic rubber or rubber elastic synthetic resin and coating the coating solution on a base material layer (coating method), by bonding the film of the rubber-like organic elastic layer or a laminate film of the layer of the materials for the rubber-like organic elastic layer formed previously one or more thermal release adhesive layers to the base material layer (dry lamination method), or by coextruding a resin composition containing the constituent materials for the base material layer with a resin composition containing the materials for the rubber-like organic elastic layer (coextrusion method).

The material for forming the rubber-like organic elastic layer may contain, as needed, known additives such as fillers, flame retardants, aging inhibitors, antistatic agents, softening agents, ultraviolet absorbents, antioxidants, plasticizers, and surfactants.

[Separator]

The double-sided adhesive tape according to the present invention may have a separator (release liner) formed on the adhesive layer surface for protection of the adhesive layer surface and prevention of blocking. The separator, which is removed when the double-sided adhesive tape is bonded to the bonding target, may not be formed. The separator for use is not particularly limited, and any common known release liner may be used. Examples thereof for use include release layer-containing base materials such as plastic films and paper surface-treated with a release agent such as a silicone-, long-chain alkyl-, fluorine- or molybdenum sulfide-based release agent; low-adhesiveness base materials of a fluorochemical polymer such as polytetrafluoroethylene, polychlorotrifluoroethylene, polyvinyl fluoride, polyvinylidene fluoride, tetrafluoroethylene-hexafluoropropylene copolymer or chlorofluoroethylene-vinylidene fluoride copolymer; low-adhesiveness base materials of a non-polar polymer such as olefinic resin (for example, polyethylene or polypropylene) and the like.

The separator above may be formed on both faces of the double-sided adhesive tape according to the present invention, or a rear-face release layer may be formed on one adhesive face in such a manner that the layer of the separator becomes in contact with the opposite-sided adhesive face of the double-sided adhesive tape when the sheet is wound into a roll shape.

The double-sided adhesive tape according to the present invention, which has a thermal release adhesive layer containing heat-expandable microspheres at least on one face of the base material layer, has favorable adhesive strength before heat treatment and thus, permits support and temporary fixation of the ultrathin glass plate and smooth processing of the organic EL panel. Heat treatment of the double-sided adhesive tape at a temperature higher than a particular temperature, when it is not needed any more, leads to expansion and/or foaming of the heat-expandable microspheres contained and thus to three-dimensional structural transition of the thermal release adhesive layer into a waving structure. Therefore, the adhesion area with the organic EL panel decreases rapidly and the adhesive strength to the organic EL panel deteriorates drastically. It is possible in this way to separate the organic EL panel easily, without contamination for example with the adhesive residue. The double-sided adhesive tape according to the present invention can be used favorably as a temporary fixing tape in the production process for organic EL panels.

[Process for Producing an Organic EL Panel]

The process for producing an organic EL panel according to the present invention is characterized by forming an organic EL element on an ultrathin glass plate, as the ultrathin glass plate is temporarily fixed to a supporting plate with the double-sided adhesive tape described above.

The material constituting the supporting plate for temporary fixing of the ultrathin glass plate is not particularly limited, if it can support the ultrathin glass plate to be bonded. However, a material harder than the ultrathin glass plate is used favorably, and examples thereof include silicon, glass, SUS plates, copper plates, acrylic plates and the like. The thickness of the supporting plate is preferably, for example, 0.4 mm or more (for example, 0.4 to 5.0 mm).

The method of bonding an ultrathin glass plate to the supporting plate via a double-sided adhesive tape is not particularly limited, if it can bond the ultrathin glass plate to the supporting plate, and these materials are bonded to each other, for example, by using a roller, a spatula or a pressing machine.

The ultrathin glass plate is preferably a transparent and colorless glass and the thickness thereof is for example about 10 to 150 µm, preferably about 10 to 70 µm, and particularly preferably about 20 to 50 µm. An ultrathin glass plate having a thickness of more than 150 µm is not sufficiently flexible any more, while an ultrathin glass plate having a thickness of less than 10 µm is fundamentally harder to produce.

The organic EL element has a configuration, for example, of positive electrode/positive hole injecting layer/positive hole transporting layer/light-emitting layer/positive hole-blocking layer/electron-transporting layer/cathode. In preparation of the organic EL element, for example, a thin film of a positive electrode substance (such as indium tin oxide: ITO) having a film thickness of 1 µm or less, preferably 10 to 200 nm, is formed by a vacuum deposition method such as PVD (physical vapor deposition) or CVD (chemical vapor deposition), to give a positive electrode. The vapor deposition temperatures in the vacuum deposition method is, for example, about 70 to 250° C.; the degree of vacuum is, for example, about $10^{-2}$ to $10^{-6}$ Pa; and the vapor deposition rate is, for example, about 0.01 to 30 nm/second.

Then, organic compound thin films of positive hole injecting layer, positive hole transporting layer, light-emitting layer, positive hole-blocking layer, and electron-transporting layer for an organic EL element material are formed thereon. Examples of the method of forming the organic compound thin films include wet processes (spin coating, casting, inkjet ejection, and printing) and the like, but vacuum deposition, spin coating, inkjet ejection, and printing processes are particularly preferable, because uniform films are easily obtained and pinholes are generated less frequently.

After the organic compound thin film is formed, a thin film of negative electrode substance is formed thereon at a film thickness adjusted to less than 1 µm, preferably in the range of 50 to 200 nm by a vacuum deposition method such as PVD (physical vapor deposition) or CVD (chemical vapor deposition), to give an organic EL element.

Further in the process for producing an organic EL panel according to the present invention, it is preferable to separate the organic EL panel from the supporting plate by lowering the adhesive power of the double-sided adhesive tape after preparation of the organic EL panel.

When the organic EL panel is separated, the heat-expandable microspheres contained in the thermal release adhesive layer constituting the double-sided adhesive tape are expanded and/or foamed by heat treatment, for drastic decrease of adhesive power and thus for separation of the organic EL panel from the supporting plate. The separated organic EL panel is recovered by a common known method.

The heating means is not particularly limited, if it can heat the double-sided adhesive tape and expand and/or foam the heat-expandable microspheres contained therein rapidly, and for example, electric heating, induction heating, magnetic heating, near-infrared ray-, mid-infrared ray or far-infrared ray heating, or oven or hot plate heating can be used without any restriction.

The heating temperature is not limited, if it is not lower than the temperature at which the heat-expandable microspheres contained in the double-sided adhesive tape start expansion and/or foaming, and it is for example 130 to 250° C., preferably about 150 to 230° C.

EXAMPLES

Hereinafter, the present invention will be described more specifically with reference to Examples, but it should be understood that the present invention is not restricted by these Examples.

ITO electrode was formed under the following condition:
Degree of vacuum: $1 \times 10^{-5}$ Pa
Target: 90% indium oxide, 10% tin oxide
Argon gas pressure: $2 \times 10^{-2}$ Torr
Bias voltage: −500 V
Substrate temperature: 110° C.
Sputtering period: 10 minutes (15 µm, 1 mm pitch)

Example 1

A toluene solution containing 100 wt parts of a pressure-sensitive adhesive based on a copolymer of 2-ethylhexyl acrylate/ethyl acrylate/methyl methacrylate/2-hydroxyethyl acrylate (30 wt parts/70 wt parts/5 wt parts/5 wt parts) and 1 wt part of an isocyanate-based crosslinking agent blended therein was coated and dried on both faces of a base substance polyester film (thickness: 100 µm) to a thickness of 20 µm after drying, to give rubber-like organic elastic layers A and B.

Then, a toluene solution containing 100 wt parts of a pressure-sensitive adhesive based on a copolymer of 2-ethylhexyl acrylate/ethyl acrylate/methyl methacrylate/2-hydroxyethyl acrylate (30 wt parts/70 wt parts/5 wt parts/5 wt parts), 2 wt parts of an isocyanate-based crosslinking agent, and 30 wt parts of heat-expandable microspheres A (trade name "Microsphere F100D", produced by Matsumoto Yushi-Seiyaku Co., Ltd., foaming-starting temperature: approximately 170° C.) blended therein was coated and dried on a separator to a thickness of 30 μm, to give thermal release adhesive layers A and B. The thermal release adhesive layers A and B obtained were laminated respectively onto the rubber-like organic elastic layers A and B, to give a double-sided adhesive tape 1 having thermal release adhesive layers on both faces of the base material.

A glass plate (thickness: 1 mm, size: 10 cm×10 cm) and an ultrathin glass plate (thickness: 50 μm) were laminated to each other via the double-sided adhesive tapes 1 without incorporation of air bubbles, to give a sample 1.

ITO electrodes were then formed, by PVD method (110° C.), on the ultrathin glass plate of the sample 1 obtained to give an organic EL panel 1 with glass plate.

Example 2

A toluene solution containing 100 wt parts of a pressure-sensitive adhesive based on a copolymer of 2-ethylhexyl acrylate/ethyl acrylate/acrylic acid (30 wt parts/70 wt parts/5 wt parts) and 2 wt parts of an isocyanate-based crosslinking agent blended therein was coated and dried on both faces of a base substance polyester film (thickness: 100 μm) to a thickness of 20 μm after drying, to give a rubber-like organic elastic layers C and D.

Then, a toluene solution containing 100 wt parts of a pressure-sensitive adhesive based on a copolymer of 2-ethylhexyl acrylate/ethyl acrylate/acrylic acid (30 wt parts/70 wt parts/5 wt parts), 5 wt parts of an isocyanate-based crosslinking agent, and 30 wt parts of heat-expandable microspheres A (trade name: "Microsphere F100D", produced by Matsumoto Yushi-Seiyaku Co., Ltd., foaming-starting temperature: approximately 170° C.) blended therein was coated and dried on a separator to a thickness of 30 μm, to give a thermal release adhesive layer C, and the thermal release adhesive layer C was laminated onto the rubber-like organic elastic layer C, to give a double-sided adhesive tape 2 having a thermal release adhesive layer on one face of the base material and a pressure-sensitive adhesive layer on the other face.

A sample 2 and an organic EL panel 2 were prepared in a manner similar to Example 1, except that the double-sided adhesive tape 1 was replaced with the double-sided adhesive tape 2.

Comparative Example 1

A double-sided adhesive tape 3 was prepared in a manner similar to Example 1, except that the heat-expandable microspheres A was replaced with a heat-expandable microspheres B (trade name: "Microsphere F50D", produced by Matsumoto Yushi-Seiyaku Co., Ltd., foaming-starting temperature: approximately 120° C.). A glass plate (thickness: 1 mm, size: 10 cm×10 cm) and an ultrathin glass plate (thickness: 50 μm) were laminated to each other via the double-sided adhesive tape 3 without incorporation of air bubbles, to give a sample 3.

ITO electrodes were then formed, by PVD method (110° C.), on the ultrathin glass plate of the sample 3 obtained to give an organic EL panel 3 with glass plate.

Comparative Example 2

A sample 4 was prepared in a manner similar to Example 1, except that the double-sided adhesive tape 1 used when the glass plate (thickness: 1 mm, size: 10 cm×10 cm) and the ultrathin glass plate (thickness: 50 μm) were laminated to each other was replaced with a pressure-sensitive double-sided adhesive tape (trade name: "No. 5000N", produced by Nitto Denko Corporation).

ITO electrodes were then formed, by PVD method (110° C.), on the ultrathin glass plate of the sample 4 obtained to give an organic EL panel 4 with glass plate.

Comparative Example 3

A sample 5 was prepared in a manner similar to Example 1, except that the double-sided adhesive tape 1 used when the glass plate (thickness: 1 mm, size: 10 cm×10 cm) and the ultrathin glass plate (thickness: 50 μm) were laminated each other was replaced with a wax (trade name: "SLOT WAX", produced by Kokonoe Electric Co., Ltd.).

ITO electrodes were then formed, by PVD method (110° C.), on the ultrathin glass plate of the sample 5 obtained to give an organic EL panel 5 with glass plate.

Evaluation Tests

[Measurement of the Amount of Offgas Generated]

Each of the samples 1 to 5 obtained in Examples and Comparative Examples was placed in a vacuum chamber heated at 110° C.; the period needed for the degree of vacuum in the vacuum chamber reach $1\times10^{-5}$ Pa when the chamber was evacuated was determined; the amount of offgas generated from each sample in the vacuum chamber when heated at 110° C. was estimated by measuring the degree of vacuum (Pa) when the sample was heated at 110° C. in a vacuum chamber kept to a pressure of $6\times10^{-8}$ Pa.

[Separation Efficiency Test]

The period (sec) needed for separation of the organic EL panel from the glass plate in each of the organic EL panels respectively with glass plates 1 to 5 obtained in Examples and Comparative Examples after preparation of the organic EL element, and also the period needed for cleaning (sec) and the amount (g) of the solvent (toluene) used for cleaning, if the rear face of the organic EL panel should be cleaned after separation, were determined. Specifically, when the organic EL panel was separated from the glass plate in the organic EL panel 1 or 2 with glass plate obtained in Example 1 or 2, the organic EL panel was separated from the glass plate, after the organic EL panel 1 or 2 with glass plate was heat-treated with a hot plate previously adjusted to 170° C. Alternatively when the organic EL panel was separated form the glass plate in the organic EL panel 3 with glass plate obtained in Comparative Example 1, the organic EL panel was separated from the glass plate, after the organic EL panel 3 with glass plate was heat-treated with a hot plate previously adjusted to 120° C. Yet alternatively when the organic EL panel was separated form the glass plate in the organic EL panel 4 with glass plate obtained in Comparative Example 2, the organic EL panel was separated from the glass plate, after the organic EL panel 4 with glass plate was heated with a hot plate previously adjusted to 60° C. and bent. When the organic EL panel was separated form the glass plate in the organic EL panel 5 with glass plate obtained in Comparative Example 3, the organic EL panel was separated from the glass plate under a force applied in the shearing direction, after the organic EL panel 5 with glass plate was heated on a hot plate previously heated to approximately 80° C. for softening the wax. In the case of the organic EL panel 5 with glass plate, the wax deposited on the organic EL panel separated from the glass plate was removed with a solvent (toluene).

[Recovery Rate of Organic EL Panel]

Ten samples of each of the organic EL panels 1 to 5 with glass plates obtained in Examples and Comparative Examples were prepared; the organic EL panel samples were subjected to the separation efficiency test above; damage on the organic EL panels recovered after separation was determined by visual observation and the recovery rate of organic EL panel (%) was calculated according to the following Formula.

Recovery rate (%)=(Number of samples separated and recovered without damage/10)×100

Evaluation results are summarized in the following Table.

TABLE 1

| | Vacuum at 110° C. (Pa) | Period needed to reach a particular vacuum (sec) | Period needed for separation of organic EL panel (sec) | Cleaning period (sec) | Amount of solvent used (g) | Organic EL panel recovery rate (%) |
|---|---|---|---|---|---|---|
| Example 1 | $6.5 \times 10^{-8}$ | 15 | 10 | 0 | 0 | 100 |
| Example 2 | $6.4 \times 10^{-8}$ | 14 | 10 | 0 | 0 | 100 |
| Comparative Example 1 | $8.0 \times 10^{-7}$ | 180 | 10 | 0 | 0 | 100 |
| Comparative Example 2 | $6.5 \times 10^{-8}$ | 15 | 330 | 0 | 0 | 20 |
| Comparative Example 3 | $6.3 \times 10^{-8}$ | 14 | 10 | 240 | 70 | 100 |

As obvious from the Table, according to the process for producing an organic EL panel of the present application it was possible to form an organic EL element by evacuating the vacuum chamber rapidly to a desired degree of vacuum without generation of offgas during preparation of the organic EL element, because the ultrathin glass plate is temporarily fixed with a double-sided adhesive tape having a thermal release adhesive layer containing heat-expandable microspheres that start expansion and/or foaming at temperature higher than the vacuum deposition temperature. In addition, it was possible, when the organic EL panel obtained is separated from the supporting plate, to separate it rapidly without residual of the adhesive by heating the double-sided adhesive tape at a temperature higher than the expansion and/or foaming-starting temperature of the heat-expandable microspheres contained therein and thus, there was no need for cleaning the rear face of the organic EL panel obtained.

On the other hand, when the ultrathin glass plate was temporarily fixed with a double-sided adhesive tape containing heat-expandable microspheres that start expansion and/or foaming at a temperature lower than the vacuum deposition temperature, there was offgas generated during preparation of the organic EL element and an elongated period was needed to make the vacuum chamber reach a particular degree of vacuum.

Additionally, when a pressure-sensitive double-sided adhesive tape containing no heat-expandable microspheres was used, there was no offgas generated, but an elongated period was needed for separation after production process and it was difficult to separate and recover the organic EL panel without damage.

Further, when wax is used, replacing the double-sided adhesive tape, there was no offgas generated and it was possible to separate the organic EL panel without damage on the organic EL panel obtained, but there was residual of the adhesive on the rear face of the separated organic EL panel, and an elongated period and a greater amount of the organic solvent for cleaning were needed for cleaning the deposited adhesion substance.

INDUSTRIAL APPLICABILITY

The organic EL panel obtained by the process for producing an organic EL panel according to the present invention is useful as a display device, a display or an emission light source in various kinds. In particular, it is possible to produce a longer-lasting display higher in flexibility and superior in gas barrier properties when the organic EL panel produced by using an ultrathin glass as the base material by the process according to the present invention.

REFERENCE SIGNS LIST

| | |
|---|---|
| 1 | Base material layer |
| 2A, 2B | Rubber-like organic elastic layer |
| 3A, 3B | Adhesive layer |
| 4 | Separator |
| 5 | Double-sided adhesive tape |

The invention claimed is:

1. A process for producing an organic electroluminescent panel by forming an organic electroluminescent element on an ultrathin glass plate by a vacuum deposition method, comprising the steps of temporarily fixing the ultrathin glass plate having a thickness of 10 to 150 µm to a supporting plate via a double-sided adhesive tape having a thermal release adhesive layer formed at least on one face of a base material layer, and containing heat-expandable microspheres that start expansion and/or foaming at temperature higher by 20° C. or more than a vacuum deposition temperature;

and forming electrodes on the ultrathin glass plate.

2. The process for producing an organic electroluminescent panel according to claim 1, wherein, in the vacuum deposition method, the deposition rate is 0.01 to 30 nm/second.

3. The process for producing an organic electroluminescent panel according to claim 1, wherein the adhesive layer on one face of the double-sided adhesive tape is a thermal release adhesive layer and the adhesive layer on the other face is a pressure-sensitive or active energy ray-curable adhesive layer.

4. The process for producing an organic electroluminescent panel according to claim 1, wherein the adhesive layers on both faces of the double-sided adhesive tape are thermal release adhesive layers.

5. The process for producing an organic electroluminescent panel according to claim 1, wherein, in the vacuum deposition method, the deposition temperature is from 70 to 250° C. and the degree of vacuum is $10^{-2}$ to $10^{-6}$ Pa.

6. The process for producing an organic electroluminescent panel according to claim 1, wherein the supporting plate has a thickness of 0.4 to 5.0 mm.

* * * * *